US007492210B2

(12) United States Patent
Imai et al.

(10) Patent No.: US 7,492,210 B2
(45) Date of Patent: Feb. 17, 2009

(54) VOLTAGE SELECTION CIRCUIT (75) Inventors: Toshiyuki Imai, Gunma (JP); Junko Kimura, Tokyo (JP)

(73) Assignees: Sanyo Electric Co., Ltd., Osaka (JP); Sanyo Semiconductor Manufacturing Co., Ltd., Niigata (JP)

( * ) Notice: Subject to any disclaimer, the term of this patent is extended or adjusted under 35 U.S.C. 154(b) by 46 days.

(21) Appl. No.: 11/614,800

(22) Filed: Dec. 21, 2006

(65) Prior Publication Data
US 2007/0152731 A1 Jul. 5, 2007

(30) Foreign Application Priority Data
Dec. 22, 2005 (JP) ............... 2005-369845

(51) Int. Cl.
*H03K 17/00* (2006.01)
(52) U.S. Cl. ...................... 327/407; 327/408
(58) Field of Classification Search .............. 327/407, 327/408
See application file for complete search history.

(56) References Cited
U.S. PATENT DOCUMENTS
6,160,437 A 12/2000 Kim 6,882,211 B2 * 4/2005 Kozaki ..................... 327/407
7,030,658 B2 * 4/2006 Murakami et al. ......... 326/112

FOREIGN PATENT DOCUMENTS
DE 29513492 10/1995
JP 10-084271 3/1998
JP 2003-032090 1/2003

OTHER PUBLICATIONS
European Patent Office Search Report, Application No. 06126890.0-1233 by Sanyo Electronic Co., Ltd.et al., Search Report dated May 3, 2007.

* cited by examiner

*Primary Examiner*—Kenneth B. Wells
(74) *Attorney, Agent, or Firm*—SoCal IP Law Group LLP; Steven C. Sereboff; John E. Gunther (57) ABSTRACT A first switch circuit includes first and second N-type MOSFETs. A second switch circuit includes third and fourth N-type MOSFETs. A control signal is input to a first inverter and a third inverter, the output of the first inverter input to a second inverter and the gate of the fourth MOSFET, the output of the second inverter input to the gate of the first MOSFET, the output of the third inverter input to a fourth inverter and the gate of the third MOSFET, the output of the fourth inverter input to the gate of the second MOSFET. A first input voltage is connected to the source of the second MOSFET and the sources of N-type MOSFETS in the third and fourth inverters. A second input voltage is connected the source of the fourth MOSFET and the sources of N-type MOSFETS in the first and second inverters.

2 Claims, 5 Drawing Sheets

VOLTAGE SELECTION CIRCUIT

CROSS-REFERENCE TO RELATED APPLICATION

This application claims the benefit of priority to Japanese Patent Application No. 2005-369845, filed Dec. 22, 2005 of which full contents are incorporated herein by reference.

BACKGROUND OF THE INVENTION

1. Technical Field

The present invention relates generally to a voltage selection circuit that selects and outputs one of a plurality of input voltages depending on a control signal, and, more particularly, to technology for outputting a stable voltage.

2. Description of the Related Art

When an electronic circuit is developed, a circuit (hereinafter, a "voltage selection circuit") may be needed to select and output one of a plurality of input voltages depending on a control signal. For example, as shown in FIG. 5, such a circuit can include MOSFETs (Metal Oxide Semiconductor Field Effect Transistors).

Figure 5:
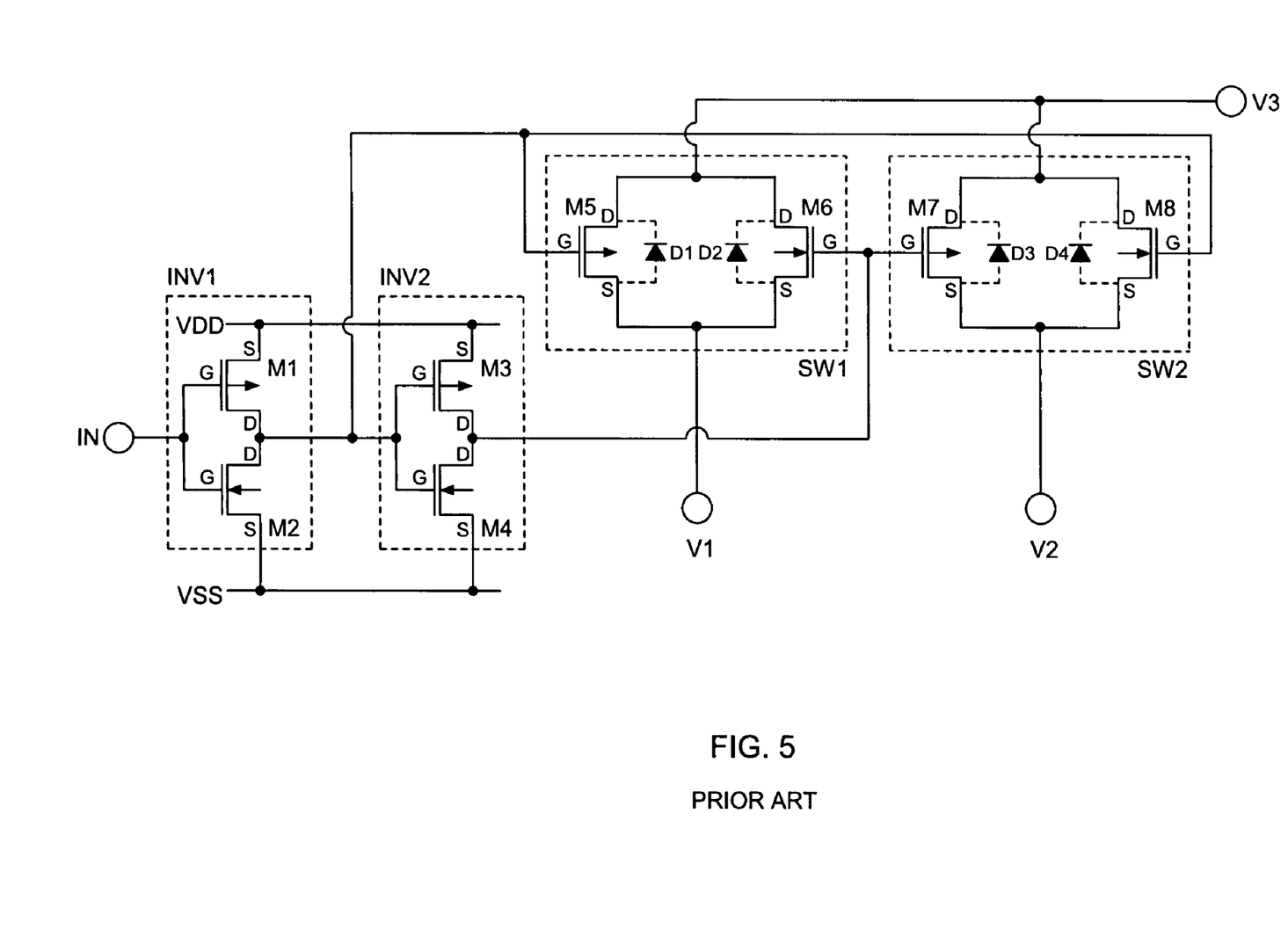
FIG. 5 depicts an example of a voltage selection circuit.

In FIG. 5, a P-MOSFET (P-type MOSFET, MOSFET of P type, M1) and an N-MOSFET (N-type MOSFET, MOSFET of N type, M2) configure a first inverter INV1. A P-MOSFET (M3) and an N-MOSFET (M4) configure a second inverter INV2. A P-MOSFET (M5) and an N-MOSFET (M6) configure a first transmission gate SW1. A P-MOSFET (M7) and an N-MOSFET (M8) configure a second transmission gate SW2. Diodes D1 to D4 are parasitic diodes of the MOSFETs (M5 to M8).

IN ("H" or "L") is a control signal input to the first inverter INV1. The output of the first inverter INV1 is input to the second inverter INV2, the gate of the MOSFET (M5), and the gate of the MOSFET (M8). The output of the second inverter INV2 is input to the gate of the MOSFET (M6) and the gate of the MOSFET (M7)

A first input voltage V1 is selected depending on the control signal IN and is applied to the source of the MOSFET (M5) and the source of the MOSFET (M6). A second input voltage V2 is selected depending on the control signal IN and is applied to the source of the MOSFET (M7) and the source of the MOSFET (M8).

The drains of the MOSFETs (M5 to M8) are connected in common and, through this connection line, an output voltage V3 is output based on either the first input voltage V1 or the second input voltage V2 selected depending on the control signal IN.

It is assumed that "H" is input as the control signal IN for the voltage selection circuit shown in FIG. 5. In this case, "L" is input to the gate of the MOSFET (M5) and the gate of the MOSFET (M8) and "H" is input to the gate of the MOSFET (M6) and the gate of the MOSFET (M7). Therefore, the transmission gate SW1 is turned on while the transmission gate SW2 is turned off, and the output voltage V3 is output as a voltage based on the first input voltage V1 in this case.

On the other hand, it is assumed that "L" is input as the control signal IN for the voltage selection circuit shown in FIG. 5. In this case, "H" is input to the gate of the MOSFET (M5) and the gate of the MOSFET (M8) and "L" is input to the gate of the MOSFET (M6) and the gate of the MOSFET (M7). Therefore, the transmission gate SW1 is turned off while the transmission gate SW2 is turned on, and the output voltage V3 is output as a voltage based on the second input voltage V2 in this case.

Figure 6:
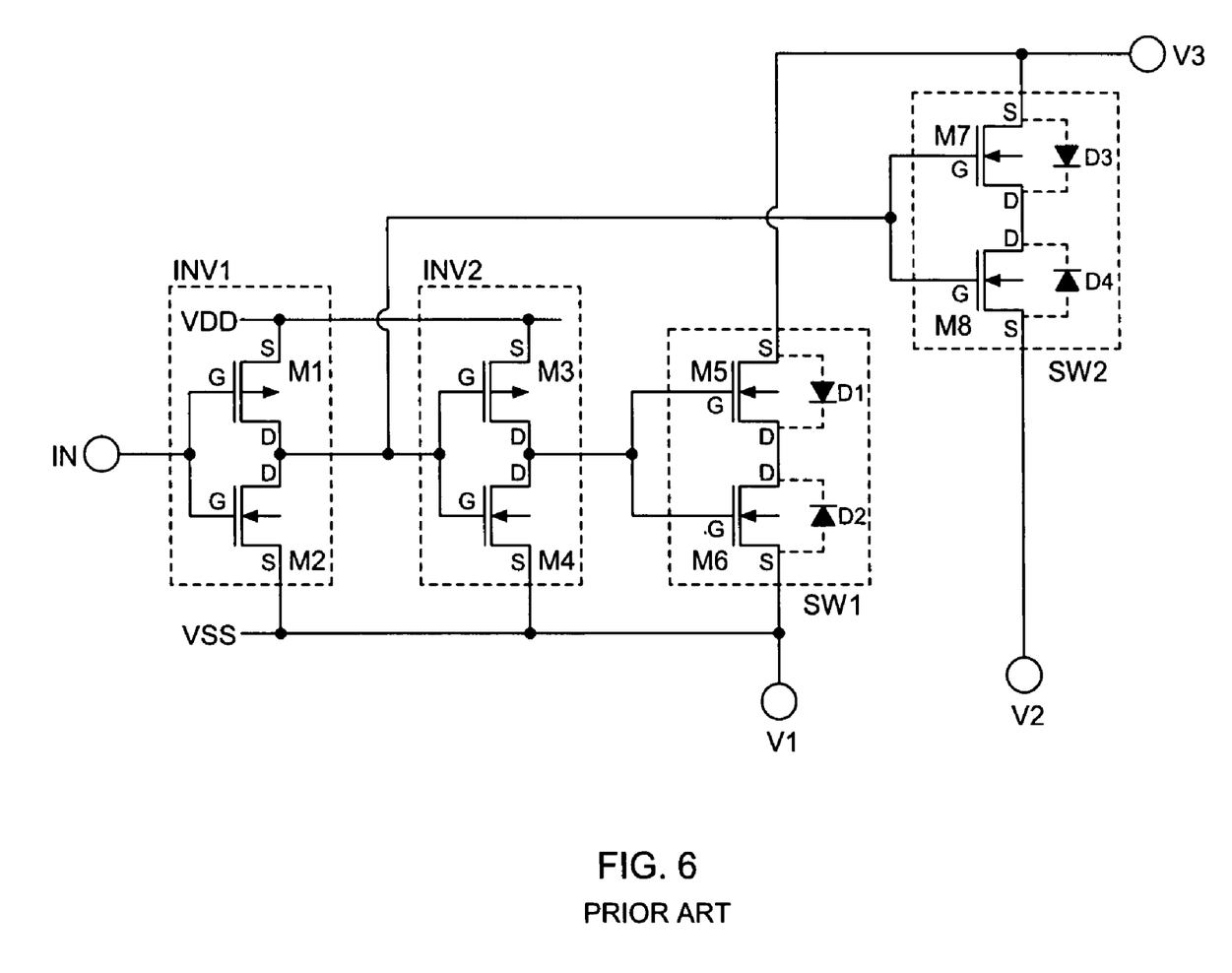
FIG. 6 depicts another example of a voltage selection circuit.

FIG. 6 shows another example of the voltage selection circuit. In FIG. 6, a P-MOSFET (M1) and an N-MOSFET (M2) configure a first inverter INV1. A P-MOSFET (M3) and an N-MOSFET (M4) configure a second inverter INV2. The drain and gate of the N-MOSFET (M5) are connected in common with the drain and gate of the N-MOSFET (M6), respectively, to configure a first switch circuit SW1. The drain and gate of the N-MOSFET (M5) are connected in common with the drain and gate of the N-MOSFET (M6), respectively, to configure a first switch circuit SW1. The drain and gate of the N-MOSFET (M7) are connected in common with the drain and gate of the N-MOSFET (M8), respectively, to configure a second switch circuit SW2. Diodes D1 to D4 are parasitic diodes of the MOSFETs (M5 to M8).

In the voltage selection circuit shown in FIG. 6, a control signal IN ("H" or "L") is input to the first inverter INV1. The output of the first inverter INV1 is input to the second inverter INV2, the gate of the MOSFET (M7), and the gate of the MOSFET (M8). The output of the second inverter INV2 is input to the gate of the MOSFET (M5) and the gate of the MOSFET (M6).

A first input voltage V1 is selected depending on the control signal IN and is applied to the source of the MOSFET (M6). A second input voltage V2 is selected depending on the control signal IN and is applied to the source of the MOSFET (M8). The source of the MOSFET (M5) and the source of the MOSFET (M7) are connected in common and, through this connection line, an output voltage V3 is output based on either the first input voltage V1 or the second input voltage V2 selected depending on the control signal IN.

It is assumed that "H" is input as the control signal IN for the voltage selection circuit shown in FIG. 6. In this case, "H" is input to the gate of the MOSFET (M5) and the gate of the MOSFET (M6) and "L" is input to the gate of the MOSFETs (M7, M8). Therefore, the switch circuit SW1 is turned on while the switch circuit SW2 is turned off, and the output voltage V3 is output as a voltage based on the first input voltage V1 in this case.

On the other hand, if "H" is input as the control signal IN, "L" is input to the gate of the MOSFET (M5) and the gate of the MOSFET (M6) and "H" is input to the gate of the MOSFET (M7) and the gate of the MOSFET (M8). Therefore, the switch circuit SW1 is turned off while the switch circuit SW2 is turned on, and the output voltage V3 is output as a voltage based on the second input voltage V2 in this case (see, Japanese Patent Application Laid-Open Publication Nos. 1998-84271 and 2003-32090).

By the way, in the circuit shown in FIG. 5, for example, if the control signal IN is "H", the MOSFET (M5) and the MOSFET (M6) are turned on, and the MOSFET (M7) and the MOSFET (M8) are turned off. If V1+Vd1<V2 is satisfied in this situation (Vd1 is a forward voltage of the parasitic diodes D3, D4), the parasitic diodes D3, D4 become conductive and an electric current is applied through a route of the parasitic diodes D3, D4→the MOSFETs (M5, M6). Similarly, when the control signal IN is "L", if V2+Vd2<V1 is satisfied (Vd2 is a forward voltage of the parasitic diodes D1, D2), the parasitic diodes D1, D2 become conductive and an electric current is applied through a route of the parasitic diodes D1, D2→the MOSFETs (M7, M8).

On the other hand, in the circuit shown in FIG. 6, for example, if the control signal IN is "H", the MOSFET (M5) and the MOSFET (M6) are turned on, and the MOSFET (M7) and the MOSFET (M8) are turned off. If V1<Vss−Vt (Vt is a voltage necessary for turning on the MOSFET (M7)) and V1+Vd3<V2 (Vd3 is a forward voltage of the parasitic diode D4) are satisfied in this situation, the gate voltage of the MOSFET (M7)=Vss is satisfied; the output voltage V3=the first input voltage V1 is satisfied because the MOSFET (M5) and the MOSFET (M6) are turned on; the gate-source voltage Vos of the MOSFET (M7)>Vt is satisfied; and the MOSFET (M7) is turned on. Therefore, an electric current is applied through a route of the parasitic diode D4 of the MOSFET (M7)→the parasitic diode D1 of the MOSFET (M5)→the MOSFET (M6).

Similarly, in the case of the control signal IN of "L", if the above voltage relationship is satisfied, the MOSFET (M6) is turned on and an electric current is applied through a route of the MOSFET (M8)→the MOSFET (M7) →the parasitic diode D1 of the MOSFET (M5) →the MOSFET (M6).

Since the current loss occurs in either circuit of FIGS. 5 and 6, the output voltage V3 becomes unstable, and the same voltage as the input voltage V1 and the second input voltage V2 cannot necessarily be acquired as the output voltage V3.

The present invention was conceived in view of the above problems and it is therefore the object of the present invention to provide a voltage selection circuit that can output a voltage equivalent to the input voltage.

SUMMARY OF THE INVENTION

In order to achieve the above object, according to an aspect of the present invention there is provided a voltage selection circuit comprising first through fourth inverters; a first switch circuit including a first MOSFET of N type and a second MOSFET of N type, respective drains thereof being connected in common; and a second switch circuit including a third MOSFET of N type and a fourth MOSFET of N type, respective drains thereof being connected in common, a common drive voltage being input to the first through fourth inverters, a control signal being input to the first inverter and the third inverter, the output of the first inverter being input to the second inverter and the gate of the fourth MOSFET, the output of the second inverter being input to the gate of the first MOSFET, the output of the third inverter being input to the fourth inverter and the gate of the third MOSFET, the output of the fourth inverter being input to the gate of the second MOSFET, a first input voltage selected depending on the control signal being input to the source of the second MOSFET, a second input voltage selected depending on the control signal being input to the source of the fourth MOSFET, the values of the drive voltage, the first input voltage, and the second input voltage being set for the first MOSFET or the third MOSFET such that each gate-source voltage thereof becomes higher than a gate-source threshold voltage at the time of turning on.

According to the present invention, when "H" is input as the control signal, since the second MOSFET is turned on, the drain voltage of the first MOSFET is the first input voltage. Since the fourth MOSFET is turned off, the drain voltage of the third MOSFET is OPEN (high-impedance). Since "H" is input to the gate of the first MOSFET, the gate voltage of the first MOSFET is the drive voltage. Since "L" is input to the gate of the third MOSFET, the gate voltage of the third MOSFET is the first input voltage.

If the current increases between the drain and the source of the first MOSFET, the source voltage of the first MOSFET approaches the first input voltage. Therefore, the gate-source voltage of the first MOSFET increases and, as a result, the source voltage (which is the output voltage) of the first MOSFET approaches the first input voltage. This positive feedback automatically and sufficiently turns on the first MOSFET and, as a result, the voltage equivalent to the first input voltage is acquired as the output voltage.

When "L" is input as the control signal IN, since the fourth MOSFET is turned on, the drain voltage of the third MOSFET is the second input voltage. Since the second MOSFET is turned off, the drain voltage of the first MOSFET is OPEN (high-impedance). Since "H" is input to the gate of the third MOSFET, the gate voltage of the third MOSFET is the drive voltage. Since "L" is input to the gate of the first MOSFET, the gate voltage of the first MOSFET is the second input voltage.

If the current increases between the drain and the source of the third MOSFET, the source voltage of the third MOSFET approaches the second input voltage. Therefore, the gate-source voltage of the third MOSFET increases and, as a result, the source voltage (which is the output voltage) of the third MOSFET approaches the second input voltage. This positive feedback automatically and sufficiently turns on the third MOSFET and, as a result, the voltage equivalent to the second input voltage V2 is acquired as the output voltage.

In the voltage selection circuit of the present invention, when "H" is input as the control signal IN, the voltage equivalent to the first input voltage is output as the output voltage and, on the other hand, when "L" is input as the control signal IN, the voltage equivalent to the second input voltage is output as the output voltage. Therefore, the voltage selection circuit of the present invention can stably output the voltage equivalent to the first input voltage or the second input voltage as the output voltage.

In order to achieve the above object, according to another aspect of the present invention there is provided a voltage selection circuit comprising a first through a fourth inverters; a first switch circuit including a first MOSFET of P type and a second MOSFET of P type, respective drains thereof being connected in common; and a second switch circuit including a third MOSFET of P type and a fourth MOSFET of P type, respective drains thereof being connected in common, a common drive voltage being input to the first through fourth inverters, a control signal being input to the first inverter and the third inverter, the output of the first inverter being input to the second inverter and the gate of the fourth MOSFET, the output of the second inverter being input to the gate of the first MOSFET, the output of the third inverter being input to the fourth inverter and the gate of the third MOSFET, the output of the fourth inverter being input to the gate of the second MOSFET, a first input voltage selected depending on the control signal being input to the source of the second MOSFET, a second input voltage selected depending on the control signal being input to the source of the fourth MOSFET, the values of the drive voltage, the first input voltage, and the second input voltage being set for the first MOSFET or the third MOSFET such that each gate-source voltage thereof becomes higher than a gate-source threshold voltage at the time of turning on.

According to the present invention, when "L" is input as the control signal, since the second MOSFET is turned on, the drain voltage of the first MOSFET is the first input voltage. Since the fourth MOSFET is turned off, the drain voltage of the third MOSFET is OPEN (high-impedance). Since "L" is input to the gate of the first MOSFET, the gate voltage of the first MOSFET is the drive voltage. Since "H" is input to the gate of the third MOSFET, the gate voltage of the third MOSFET is the first input voltage.

If the current increases between the drain and the source of the first MOSFET, the source voltage of the first MOSFET approaches the first input voltage. Therefore, the gate-source voltage of the first MOSFET increases and, as a result, the source voltage (which is the output voltage) of the first MOSFET approaches the first input voltage. This positive feedback automatically and sufficiently turns on the first MOSFET and, as a result, the voltage equivalent to the first input voltage is acquired as the output voltage.

When "H" is input as the control signal IN, since the fourth MOSFET is turned on, the drain voltage of the third MOSFET is the second input voltage. Since the second MOSFET is turned off, the drain voltage of the first MOSFET is OPEN (high-impedance). Since "L" is input to the gate of the third MOSFET, the gate voltage of the third MOSFET is the drive voltage. Since "H" is input to the gate of the first MOSFET, the gate voltage of the first MOSFET is the second input voltage.

If the current increases between the drain and the source of the third MOSFET, the source voltage of the third MOSFET approaches the second input voltage. Therefore, the gate-source voltage of the third MOSFET increases and, as a result, the source voltage (which is the output voltage) of the third MOSFET approaches the second input voltage. This positive feedback automatically and sufficiently turns on the third MOSFET and, as a result, the voltage equivalent to the second input voltage V2 is acquired as the output voltage.

In the voltage selection circuit of the present invention, when "L" is input as the control signal IN, the voltage equivalent to the first input voltage is output as the output voltage and, on the other hand, when "H" is input as the control signal IN, the voltage equivalent to the second input voltage is output as the output voltage. Therefore, the voltage selection circuit of the present invention can stably output the voltage equivalent to the first input voltage or the second input voltage as the output voltage.

The present invention can provide a voltage selection circuit that can stably output a voltage equivalent to an input voltage.

BRIEF DESCRIPTION OF THE DRAWINGS

To understand the present invention and the advantages thereof more thoroughly, the following description should be referenced in conjunction with the accompanying drawings.

DETAILED DESCRIPTION OF THE INVENTION

From the contents of the description and the accompanying drawings, at least the following details will become apparent.

FIRST EMBODIMENT

Figure 1:
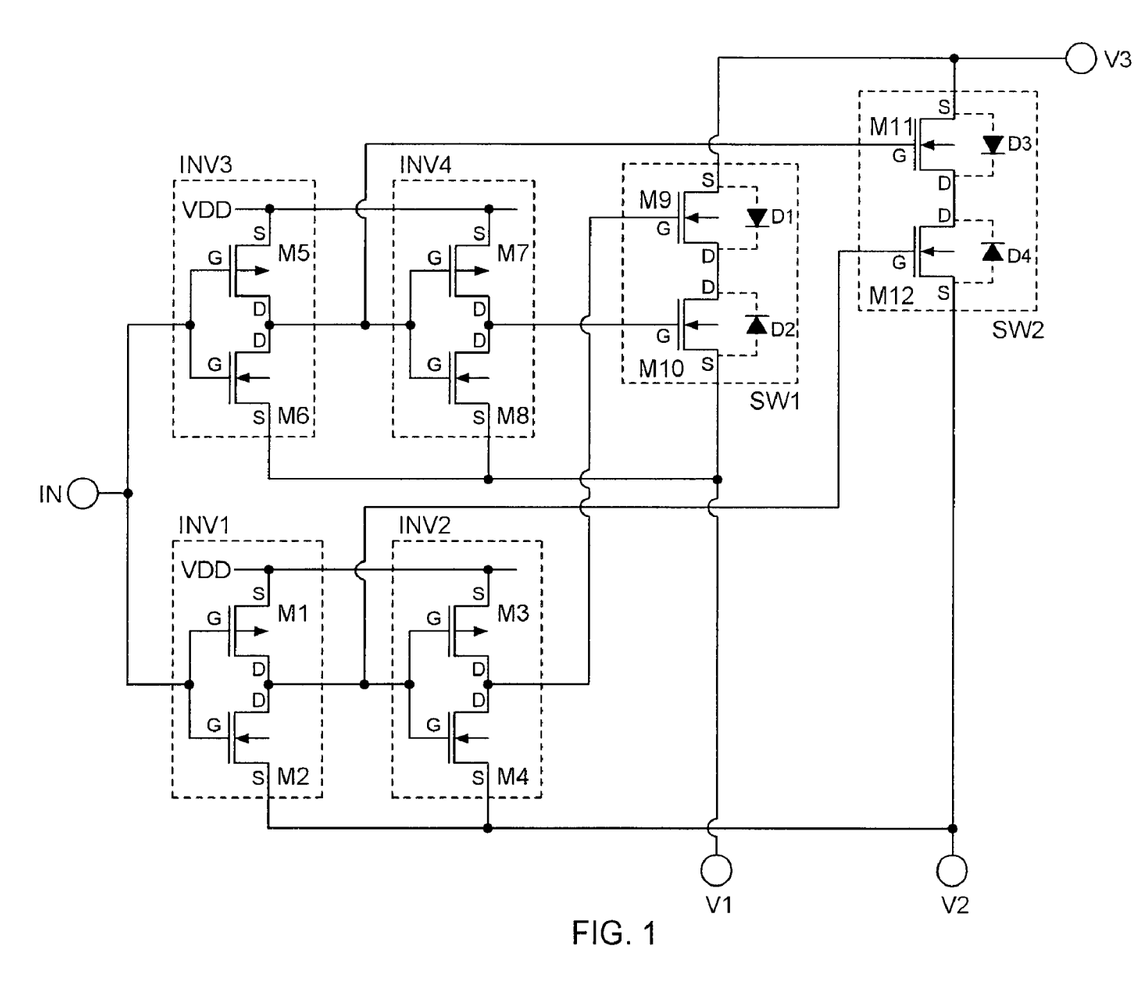
FIG. 1 is a circuit diagram of a voltage selection circuit including MOSFETs, which is described as one embodiment of the present invention.

FIG. 1 depicts a circuit diagram of a voltage selection circuit including MOSFETs, which is described as one embodiment of the present invention. In FIG. 1, a P-MOSFET (M1) and an N-MOSFET (M2) configure a first inverter INV1. A P-MOSFET (M3) and an N-MOSFET (M4) configure a second inverter INV2. A P-MOSFET (M5) and an N-MOSFET (M6) configure a third inverter INV3. A P-MOSFET (M7) and an N-MOSFET (M8) configure a fourth inverter INV4.

A drain of an N-MOSFET (M9) (first MOSFET) and a drain of an N-MOSFET (M10) (second MOSFET) are connected in common to configure a first switch circuit SW1. A drain of an N-MOSFET (M11) (third MOSFET) and a drain of an N-MOSFET (M12) (fourth MOSFET) are connected in common to configure a second switch circuit SW2. In FIG. 1, diodes D1 to D4 depicted along with the MOSFETs (M9 to M12) are parasitic diodes of the MOSFETs (M9 to M12).

In the voltage selection circuit shown in FIG. 1, a control signal IN ("H" or "L") is input to the first inverter INV1 and the third inverter INV3 in common. The output of the first inverter INV1 is input to the second inverter INV2 and the gate of the MOSFET (M12). The output of the second inverter INV2 is input to the gate of the MOSFET (M9). The output of the third inverter INV3 is input to the fourth inverter INV4 and the gate of the MOSFET (M11). The output of the fourth inverter INV4 is input to the gate of the MOSFET (M10). A drive voltage VDD is applied to the sources of the MOSFETs (M1, M3, M5, M7).

A second input voltage V2, which is selected depending on the control signal IN, is applied to the source of the MOSFET (M2) and the source of the MOSFET (M4). A first input voltage V1, which is selected depending on the control signal IN, is applied to the source of the MOSFET (M6) and the source of the MOSFET (M8). The source of the MOSFET (M9) and the source of the MOSFET (M11) are connected in common and, through this connection line, an output voltage V3 is output based on either the first input voltage V1 or the second input voltage V2 selected depending on the control signal IN.

It is assumed that "H" is input as the control signal IN for the voltage selection circuit shown in FIG. 1. In this case, "H" is input to the gate of the MOSFET (M9) and the gate of the MOSFET (M10). "L" is input to the gate of the MOSFET (M11) and the gate of the MOSFET (M12). Therefore, the switch circuit SW1 is turned on while the switch circuit SW2 is turned off, and a voltage based on the first input voltage V1 is output as the output voltage V3.

Figure 2:
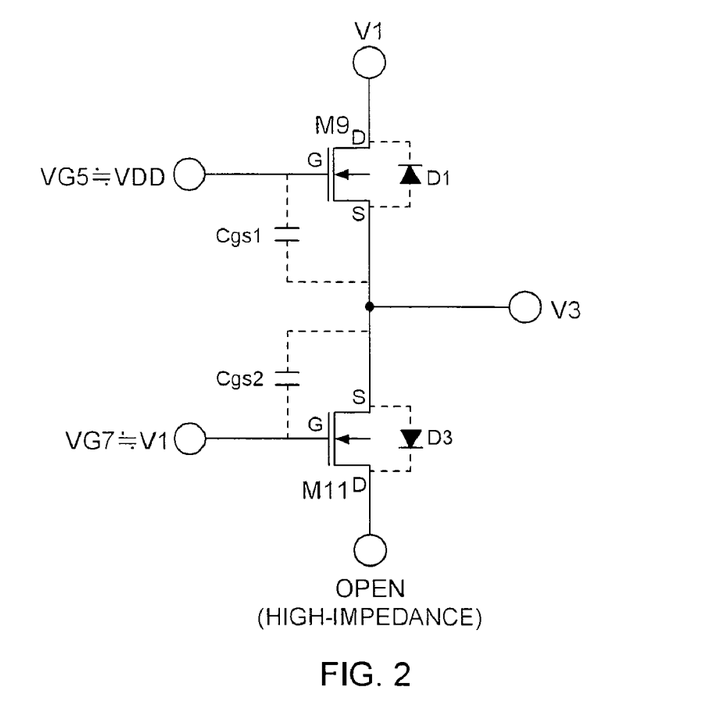
FIG. 2 is an equivalent circuit explaining a state of a voltage input to each terminal of MOSFET (M9) and MOSFET (M11) shown as one embodiment of the present invention.

FIG. 2 is an equivalent circuit explaining a state of the voltage applied to each terminal of the MOSFET (M9) and MOSFET (M11) at this point. In FIG. 2, Cgs1 is a parasitic capacitance between the gate and the source of the MOSFET (M9) and Cgs2 is a parasitic capacitance between the gate and the source of the MOSFET (M11).

As shown in FIG. 2, since the MOSFET (M10) is turned on at this point, the drain voltage of the MOSFET (M9) is the first input voltage V1. Since the MOSFET (M12) is turned off, the drain voltage of the MOSFET (M11) is OPEN (high-impedance). Since the MOSFET (M3) is turned on at this point, the gate voltage of the MOSFET (M9) is VDD and, since the MOSFET (M6) is turned on, the gate voltage of the MOSFET (M11) is the first input voltage V1.

If the current increases between the drain and the source of the MOSFET (M9), the source voltage of the MOSFET (M9) approaches the first input voltage V1. Therefore, the gate-source voltage of the MOSFET (M9) increases and, as a result, the source voltage (voltage of the output voltage V3) of the MOSFET (M9) approaches the first input voltage V1. This positive feedback automatically and sufficiently turns on the MOSFET (M9) and, as a result, the voltage equivalent to the first input voltage V1 is acquired as the output voltage V3.

To make the MOSFET (M9) conductive between the drain and the source when the MOSFET (M11) is turned on, if Vth is a threshold voltage between the gate and the source of the MOSFET (M9), the gate-source voltage VGS of the MOSFET (M9) must satisfy a condition that VGS is higher than Vth (VGS>Vth) (e.g., if the degrees of the parasitic capacitances Cgs1, Cgs2 are the same, the above condition is (VDD−V1)/2>Vth).

On the other hand, if "L" is input as the control signal IN for the voltage selection circuit shown in FIG. 1, "L" is input to the gate of the MOSFET (M9) and the gate of the MOSFET (M10). "H" is input to the gate of the MOSFET (M11) and the gate of the MOSFET (M12). Therefore, the switch circuit SW1 is turned off while the switch circuit SW2 is turned on, and the output voltage V3 is output as a voltage based on the second input voltage V2.

Figure 3:
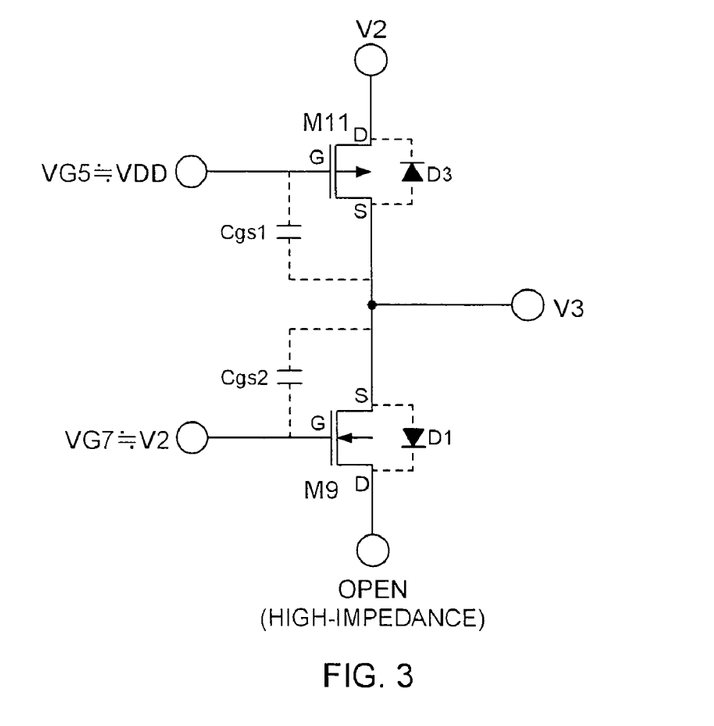
FIG. 3 is an equivalent circuit explaining a state of a voltage input to each terminal of MOSFET (M10) and MOSFET (M12) shown as one embodiment of the present invention.

FIG. 3 is an equivalent circuit explaining a state of the voltage input to each terminal of the MOSFET (M10) and MOSFET (M12) in this case. As shown in FIG. 3, since the MOSFET (M12) is turned on, the drain voltage of the MOSFET (M11) is the second input voltage V2. Since the MOSFET (M10) is turned off, the drain voltage of the MOSFET (M9) is OPEN (high-impedance). Since "H" is input to the gate of the MOSFET (M11), the gate voltage of the MOSFET (M11) is VDD. Since "L" is input to the gate of the MOSFET (M9), the gate voltage of the MOSFET (M9) is the second input voltage V2.

If the current increases between the drain and the source of the MOSFET (M11), the source voltage of the MOSFET (M11) approaches the second input voltage V2. Therefore, the gate-source voltage of the MOSFET (M11) increases and, as a result, the source voltage (voltage of the output voltage V3) of the MOSFET (M11) approaches the second input voltage V2. This positive feedback automatically and sufficiently turns on the MOSFET (M11) and, as a result, the voltage equivalent to the second input voltage V2 is acquired as the output voltage V3.

To make the MOSFET (M11) conductive between the drain and the source when the MOSFET (M11) is turned on, if Vth is a threshold voltage between the gate and the source of the MOSFET (M11), the gate-source voltage VGS of the MOSFET (M11) must satisfy a condition that VGS is higher than Vth (VGS>Vth) (e.g., if the degrees of the parasitic capacitances Cgsl, Cgs2 are the same, the above condition is (VDD−V2)/2>Vth).

As described above, in the voltage selection circuit of the embodiment, when "H" is input as the control signal IN, the voltage equivalent to the first input voltage is output as the output voltage V3 and, on the other hand, when "L" is input as the control signal IN, the voltage equivalent to the second input voltage is output as the output voltage V3. Therefore, the voltage selection circuit of the embodiment can stably output the voltage equivalent to the first input voltage V1 or the second input voltage V2 as the output voltage V3 almost without current loss.

To operate the voltage selection circuit including the above configuration as described above, if either "H" or "L" is input as the control signal IN, each value of VDD, the first input value V1, and the second input value V2 must be set such that the condition of VGS>Vth is satisfied when the MOSFET (M9) or the MOSFET (M11) is turned on.

SECOND EMBODIMENT

By the way, although the switch circuits SW1, SW2 are configured by using the N-MOSFETs, P-MOSFETs can be used to configure the switch circuits SW1, SW2.

Figure 4:
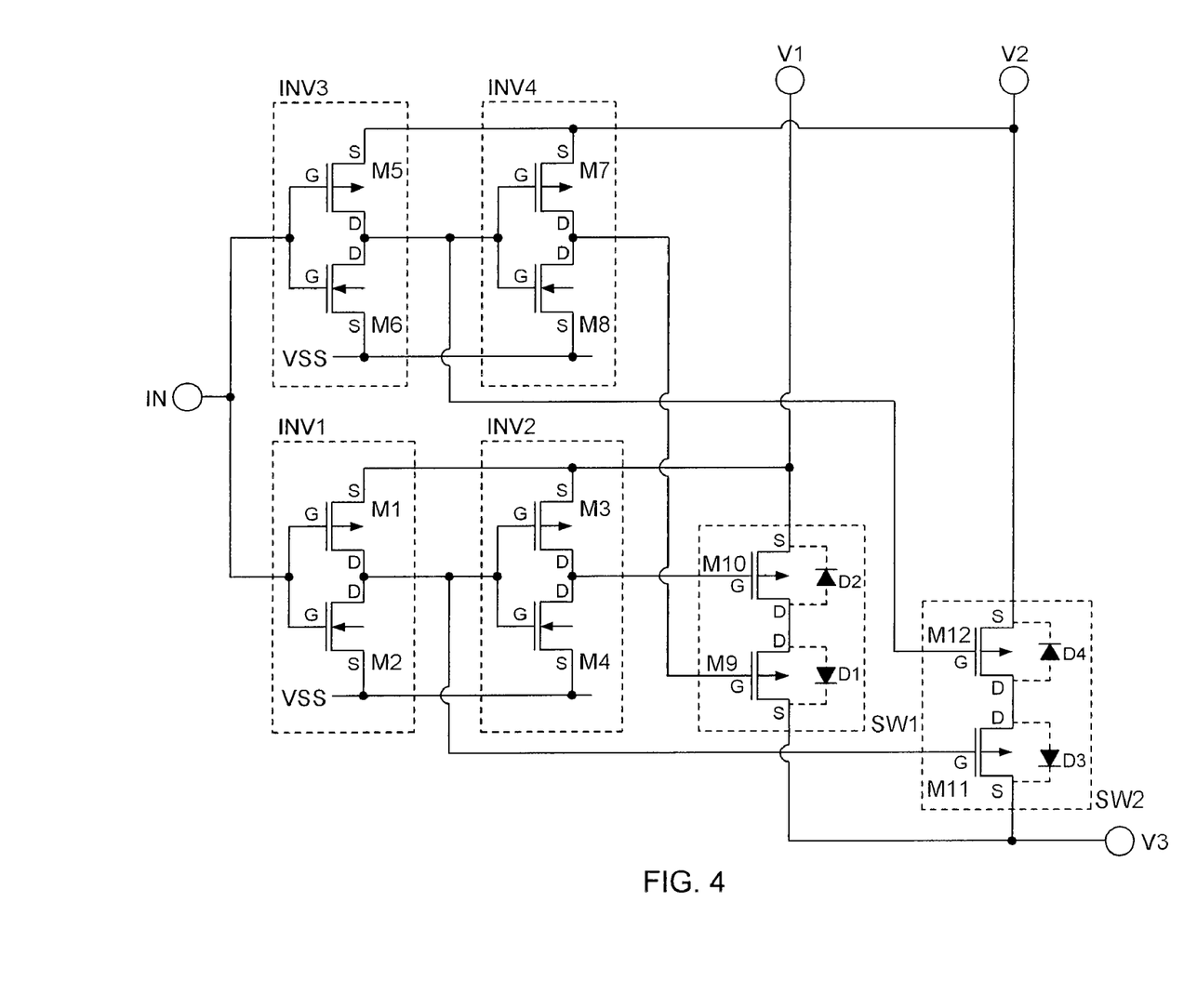
FIG. 4 is a circuit diagram of a voltage selection circuit including MOSFETs, which is described as one embodiment of the present invention.

FIG. 4 is an example of a voltage selection circuit configured including the switch circuits SW1, SW2 configured by using P-MOSFETs. In FIG. 4, the configurations of the first to fourth inverters INV1 to INV4 are the same as FIG. 1.

A drain of a P-MOSFET (M9) (first MOSFET) and a drain of a P-MOSFET (M10) (second MOSFET) are connected in common to configure a first switch circuit SW1. A drain of a P-MOSFET (M11) (third MOSFET) and a drain of a P-MOSFET (M12) (fourth MOSFET) are connected in common to configure a second switch circuit SW2. In FIG. 4, diodes D1 to D4 depicted along with the MOSFETs (M9 to M12) are parasitic diodes of the MOSFETs (M9 to M12).

The control signal IN ("H" or "L") is input to the first inverter INV1 and the third inverter INV3 in common. The output of the first inverter INV1 is input to the second inverter INV2 and the gate of the MOSFET (M12). The output of the second inverter INV2 is input to the gate of the MOSFET (M9). The output of the third inverter INV3 is input to the fourth inverter INV4 and the gate of the MOSFET (M11). The output of the fourth inverter INV4 is input to the gate of the MOSFET (M10). A voltage VSS is applied to the sources of the MOSFETs (M2, M4, M6, M8).

A second input voltage V2, which is selected depending on the control signal IN, is applied to the source of the MOSFET (M2) and the source of the MOSFET (M4). A first input voltage V1, which is selected depending on the control signal IN, is applied to the source of the MOSFET (M6) and the source of the MOSFET (M8). The source of the MOSFET (M9) and the source of the MOSFET (M11) are connected in common and, through this connection line, an output voltage V3 is output based on either the first input voltage V1 or the second input voltage V2 selected depending on the control signal IN.

It is assumed that "L" is input as the control signal IN for the voltage selection circuit shown in FIG. 4. In this case, "L" is input to the gate of the MOSFET (M9) and the gate of the MOSFET (M10). "H" is input to the gate of the MOSFET (M11) and the gate of the MOSFET (M12). Therefore, the switch circuit SW1 is turned on while the switch circuit SW2 is turned off, and a voltage based on the first input voltage V1 is output as the output voltage V3.

If the current increases between the drain and the source of the MOSFET (M9), the source voltage of the MOSFET (M9) approaches the first input voltage V1. Therefore, the gate-source voltage of the MOSFET (M9) increases and, as a result, the source voltage (voltage of the output voltage V3) of the MOSFET (M9) approaches the first input voltage V1. This positive feedback automatically and sufficiently turns on the MOSFET (M9) and, as a result, the voltage equivalent to the first input voltage V1 is acquired as the output voltage V3.

To make the MOSFET (M9) conductive between the drain and the source when the MOSFET (M11) is turned on, if Vth is a threshold voltage between the gate and the source of the MOSFET (M9), the gate-source voltage VGS of the MOSFET (M9) must satisfy a condition that VGS is higher than Vth (VGS>Vth) (e.g., if the degree of the parasitic capacitance Cgs1 between the gate and the source of the MOSFET (M9) is equivalent to the degree of the parasitic capacitance Cgs2 between the gate and the source of the MOSFET (M11), the above condition is (V1−VSS)/2>Vth).

On the other hand, if "H" is input as the control signal IN for the voltage selection circuit shown in FIG. 4, "H" is input to the gate of the MOSFET (M9) and the gate of the MOSFET (M10). "L" is input to the gate of the MOSFET (M11) and the gate of the MOSFET (M12). Therefore, the switch circuit SW1 is turned off while the switch circuit SW2 is turned on, and the output voltage V3 is output as a voltage based on the second input voltage V2.

If the current increases between the drain and the source of the MOSFET (M11), the source voltage of the MOSFET (M11) approaches the second input voltage V2. Therefore, the gate-source voltage of the MOSFET (M11) increases and, as a result, the source voltage (voltage of the output voltage V3) of the MOSFET (M11) approaches the second input voltage V2. This positive feedback automatically and sufficiently turns on the MOSFET (M11) and, as a result, the voltage equivalent to the second input voltage V2 is acquired as the output voltage V3.

To make the MOSFET (M11) conductive between the drain and the source when the MOSFET (M11) is turned on, if Vth is a threshold voltage between the gate and the source of the MOSFET (M11), the gate-source voltage VGS of the MOSFET (M11) must satisfy a condition that VGS is higher than Vth (VGS>Vth) (e.g., if the degree of the parasitic capacitance Cgs1 between the gate and the source of the MOSFET (M9) is equivalent to the degree of the parasitic capacitance Cgs2 between the gate and the source of the MOSFET (M11), the above condition is (V2−VSS)/2>Vth).

The voltage selection circuit can be configured by using the P-MOSFETs for the switch circuits SW1, SW2 as above. In the voltage selection circuit of the embodiment, when "L" is input as the control signal IN, the voltage equivalent to the first input voltage is output as the output voltage V3 and, on the other hand, when "H" is input as the control signal IN, the voltage equivalent to the second input voltage is output as the output voltage V3. Therefore, the voltage selection circuit of the embodiment can stably output the voltage equivalent to the first input voltage V1 or the second input voltage V2 as the output voltage V3 almost without current loss.

To operate the voltage selection circuit including the above configuration as described above, if either "L" or "H" is input as the control signal IN, each value of VSS, the first input value V1, and the second input value V2 must be set such that the condition of VGS>Vth is satisfied when the MOSFET (M9) or the MOSFET (M11) is turned on.

Although one embodiment of the present invention has been described in detail, the above embodiments are for the purpose of facilitating the understanding of the present invention and do not limit the present invention. The present invention may be changed/altered without departing from the spirit thereof and the present invention naturally encompasses the equivalents thereof.

What is claimed is:

1. A voltage selection circuit comprising:
first through fourth inverters;
a first switch circuit including a first MOSFET of N type and a second MOSFET of N type, respective drains thereof being connected in common; and
a second switch circuit including a third MOSFET of N type and a fourth MOSFET of N type, respective drains thereof being connected in common,
a common drive voltage being input to the sources of P-type MOSFETS included respectively in the first through fourth inverters,
a first input voltage being input to the sources of N-type MOSFETS included respectively in the third inverter and the fourth inverter,
a second input voltage being input to the sources of N-type MOSFETS included respectively in the first inverter and the second inverter,
a control signal being input to the first inverter and the third inverter,
the output of the first inverter being input to the second inverter and the gate of the fourth MOSFET,
the output of the second inverter being input to the gate of the first MOSFET,
the output of the third inverter being input to the fourth inverter and the gate of the third MOSFET,
the output of the fourth inverter being input to the gate of the second MOSFET,
the first input voltage being input to the source of the second MOSFET,
the second input voltage being input to the source of the fourth MOSFET,
the sources of the first MOSFET and the third MOSFET being connected in common to provide an output from the voltage selection circuit, and
the values of the drive voltage, the first input voltage, and the second input voltage being set for the first MOSFET or the third MOSFET such that each gate-source voltage thereof becomes higher than a gate-source threshold voltage at the time of turning on.

2. A voltage selection circuit comprising:
first through fourth inverters;
a first switch circuit including a first MOSFET of P type and a second MOSFET of P type, respective drains thereof being connected in common; and
a second switch circuit including a third MOSFET of P type and a fourth MOSFET of P type, respective drains thereof being connected in common,
a common drive voltage being input to the sources of N-type MOSFETS included respectively in the first through fourth inverters,
a first input voltage being input to the sources of P-type MOSFETS included respectively in the third inverter and the fourth inverter,
a second input voltage being input to the sources of P-type MOSFETS included respectively in the first inverter and the second inverter,
a control signal being input to the first inverter and the third inverter, the output of the first inverter being input to the second inverter and the gate of the fourth MOSFET,
the output of the second inverter being input to the gate of the first MOSFET,
the output of the third inverter being input to the fourth inverter and the gate of the third MOSFET,
the output of the fourth inverter being input to the gate of the second MOSFET,
the first input voltage being input to the source of the second MOSFET,
the second input voltage being input to the source of the fourth MOSFET,
the sources of the first MOSFET and the third MOSFET being connected in common to provide an output from the voltage selection circuit, and the values of the drive voltage, the first input voltage, and the second input voltage being set for the first MOSFET or the third MOSFET such that each gate-source voltage thereof becomes higher than a gate-source threshold voltage at the time of turning on. on.

* * * * *